(12) United States Patent
Suzuki et al.

(10) Patent No.: US 10,269,849 B2
(45) Date of Patent: Apr. 23, 2019

(54) IMAGING DEVICE INCLUDING PHOTOELECTRIC CONVERSION FILM FOR CONTINUOUSLY COVERING ELECTRODES HAVING A DISTANCE BETWEEN A COUNTER ELECTRODE AND A PIXEL ELECTRODE OR AN INTERMEDIATE ELECTRODE IS SMALLER THAN A DISTANCE BETWEEN THE COUNTER ELECTRODE AND AN INSULATING MEMBER

(71) Applicant: CANON KABUSHIKI KAISHA, Tokyo (JP)

(72) Inventors: Sho Suzuki, Yokohama (JP); Tatsuya Ryoki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 48 days.

(21) Appl. No.: 15/480,251

(22) Filed: Apr. 5, 2017

(65) Prior Publication Data

US 2017/0207260 A1 Jul. 20, 2017

Related U.S. Application Data

(63) Continuation of application No. 14/863,254, filed on Sep. 23, 2015, now Pat. No. 9,647,018.

(30) Foreign Application Priority Data

Sep. 26, 2014 (JP) .................................. 2014-196672

(51) Int. Cl.
*H01L 27/146* (2006.01)

(52) U.S. Cl.
CPC ...... *H01L 27/1463* (2013.01); *H01L 27/1464* (2013.01); *H01L 27/14607* (2013.01);
(Continued)

(58) Field of Classification Search
CPC ......... H01L 27/14607; H01L 27/14627; H01L 27/1463; H01L 27/14636; H01L 27/1464; H01L 27/14687
(Continued)

(56) References Cited

U.S. PATENT DOCUMENTS 9,991,305 B2* 6/2018 Goden ............... H01L 27/1463
2009/0065828 A1 3/2009 Hwang
(Continued)

FOREIGN PATENT DOCUMENTS

JP S57173969 A 10/1982
JP H09-275201 A 10/1997
(Continued)

*Primary Examiner* — Que Tan Le
(74) *Attorney, Agent, or Firm* — Canon U.S.A., Inc. IP Division (57) ABSTRACT

An imaging device includes a first pixel electrode, a second pixel electrode adjacent to the first pixel electrode, and a photoelectric conversion film continuously covering the first pixel electrode and the second pixel electrode, in which an insulating film is provided between the first pixel electrode and the photoelectric conversion film, and between the second pixel electrode and the photoelectric conversion film, and an intermediate electrode is provided in a position between the first pixel electrode and the second pixel electrode, the intermediate electrode being in contact with a surface of the photoelectric conversion film, the surface being on a side where the first and second pixel electrodes are arranged.

20 Claims, 6 Drawing Sheets

(52) U.S. Cl.
CPC .. *H01L 27/14621* (2013.01); *H01L 27/14627* (2013.01); *H01L 27/14634* (2013.01); *H01L 27/14636* (2013.01); *H01L 27/14687* (2013.01)

(58) Field of Classification Search
USPC .......................................... 250/208.1, 214 R
See application file for complete search history.

(56) References Cited

U.S. PATENT DOCUMENTS

| | | |
|---|---|---|
| 2013/0093932 A1 | 4/2013 | Choo et al. |
| 2013/0256544 A1 | 10/2013 | Senda et al. |

FOREIGN PATENT DOCUMENTS

| | | |
|---|---|---|
| JP | 2008-198910 A | 8/2008 |
| JP | 2008256677 A | 10/2008 |
| JP | 2011-238781 A | 11/2011 |
| JP | 2013-205140 A | 10/2013 |
| WO | 2011/148436 A | 12/2011 |
| WO | 2013/111637 A1 | 8/2013 |

\* cited by examiner

IMAGING DEVICE INCLUDING PHOTOELECTRIC CONVERSION FILM FOR CONTINUOUSLY COVERING ELECTRODES HAVING A DISTANCE BETWEEN A COUNTER ELECTRODE AND A PIXEL ELECTRODE OR AN INTERMEDIATE ELECTRODE IS SMALLER THAN A DISTANCE BETWEEN THE COUNTER ELECTRODE AND AN INSULATING MEMBER

CROSS REFERENCE TO RELATED APPLICATIONS

The present application is a continuation of U.S. patent application Ser. No. 14/863,254, filed on Sep. 23, 2015, which claims priority from Japanese Patent Application No. 2014-196672 filed Sep. 26, 2014, which is hereby incorporated by reference herein in its entirety.

BACKGROUND OF THE INVENTION

Field of the Invention

The present technology relates to an imaging device including a photoelectric conversion film.

Description of the Related Art

Imaging devices including an electrode (pixel electrode) provided in each pixel, a photoelectric conversion film that covers the pixel electrode, and a counter electrode provided on the photoelectric conversion film and facing the pixel electrode, on a semiconductor substrate provided with a circuit, are known.

WO 2012/004923 A describes that, in a solid-state imaging device in which the pixel electrode and the photoelectric conversion film are arranged through an insulating film, a predetermined voltage is applied to a transparent electrode that faces the pixel electrode, so that electric carriers in the photoelectric conversion film are discharged into the transparent electrode.

However, the technology disclosed in WO 2012/004923 A fails to address the possibility of occurrence of image lag when a signal is read at a high speed.

SUMMARY OF THE INVENTION

According to an aspect of the present disclosure, there is provided an imaging device that includes a first pixel electrode, a second pixel electrode adjacent to the first pixel electrode, and a photoelectric conversion film that continuously covers the first pixel electrode and the second pixel electrode, wherein an insulating film is provided between the first pixel electrode and the photoelectric conversion film, and between the second pixel electrode and the photoelectric conversion film, and an intermediate electrode is provided in a position between the first pixel electrode and the second pixel electrode, the intermediate electrode being in contact with a surface of the photoelectric conversion film, the surface being on a side where the first pixel electrode and the second pixel electrode are arranged.

Further features of the present invention will become apparent from the following description of exemplary embodiments (with reference to the attached drawings).

DESCRIPTION OF THE EMBODIMENTS

Hereinafter, exemplary embodiments for implementing the present technology will be described with reference to the drawings. Note, that in the description below and the drawings, a common configuration across a plurality of drawings is denoted with the same reference signs. Therefore, the common configuration is described with cross-reference to the plurality of drawings, and description of the configuration denoted with the common reference sign is appropriately omitted.

Figure 1A:
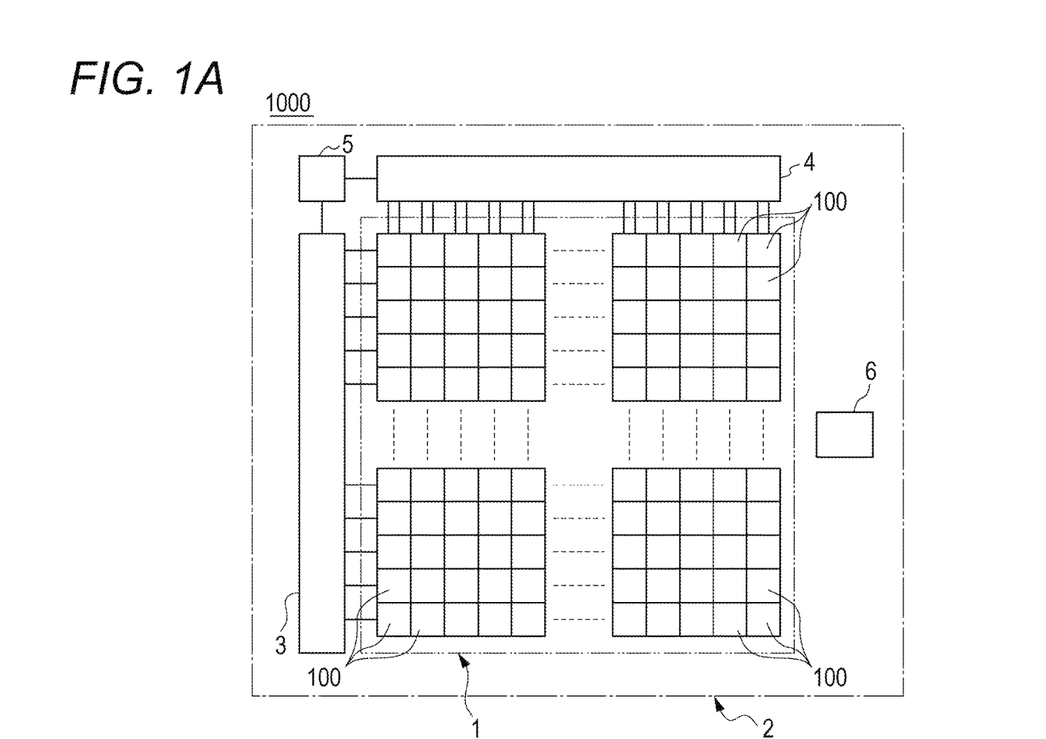
FIGS. 1A and 1B are schematic plan views illustrating an example of an imaging device.

An overall configuration of an imaging device 1000 will be described with reference to FIG. 1A. As illustrated in FIG. 1A, in an imaging device 1000, a plurality of pixels 100 is arranged in two-dimensional arrangement, for example, arrayed in a matrix manner (matrix form) in a pixel region 1 surrounded by the two-dot chain line. A peripheral circuit including a vertical scanning circuit 3, a horizontal scanning circuit 4, a pulse generation circuit 5, and the like is provided in a peripheral region 2 outside the pixel region 1 and surrounded by the chain line. The vertical scanning circuit 3 and the horizontal scanning circuit 4 are configured from a shift register. The vertical scanning circuit 3 sequentially outputs drive pulses to the respective pixels 100, in response to application of timing pulses from the pulse generation circuit 5. The horizontal scanning circuit 4 sequentially outputs signals based on signals from the pixels 100, in response to application of timing pulses from the pulse generation circuit 5. A control circuit 6 controls potentials of a counter electrode and an intermediate electrode described below.

Figure 1B:
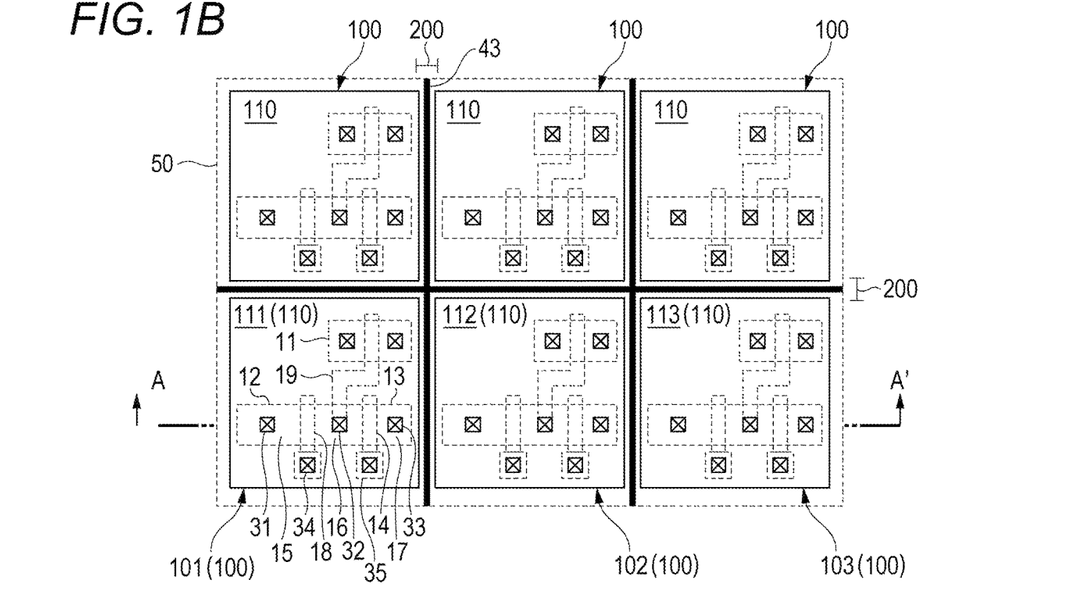

FIG. 1B is a plan view illustrating six pixels of the pixels of the pixel region 1 of the imaging device 1000 illustrated in FIG. 1A. The pixels 100 can be divided by a pixel boundary portion 200. Each pixel 100 includes a photoelectric conversion unit, and a pixel circuit 110 that reads signal electric carriers caused in the photoelectric conversion unit, and generates a signal based on the signal electric carriers. Although details will be provided below, the photoelectric conversion unit of each pixel corresponds to a part of a photoelectric conversion film 50 continuously provided across a plurality of pixels. Although details will be provided below, an intermediate electrode 43 is arranged in the pixel boundary portion 200.

FIG. 1B illustrates six pixels including a first pixel 101, a second pixel 102, and a third pixel 103, as the pixels 100 included in the imaging device 1000. The first pixel 101, the second pixel 102, and the third pixel 103 respectively include pixel circuits 111, 112, and 113.

The pixel circuit 110 includes a switch transistor 12 having an n-type impurity region 15 as a source, an n-type impurity region 16 as a drain, and a gate 18. Further, the pixel circuit 110 includes a reset transistor 13 having an n-type impurity region 16 as a source, an n-type impurity region 17 as a drain, and a gate 14. Further, the pixel circuit 110 includes an amplifying transistor 11 having a gate 19 connected with the n-type impurity region 16. The amplifying transistor 11 configures a source follower circuit, for example. Further, connecting portions 31 to 35 connected with wiring are provided in the impurity regions and the gates.

The imaging device 1000 can include a package for accommodating a chip, in addition to the chip that includes the above-described pixel region 1. An imaging system can be built using the imaging device 1000. The imaging system is a camera or an information terminal having a capturing function. The imaging system can include a signal processing device that processes a signal obtained from the imaging device and/or a display that displays an image captured by the imaging device.

First Exemplary Embodiment

Figure 2:
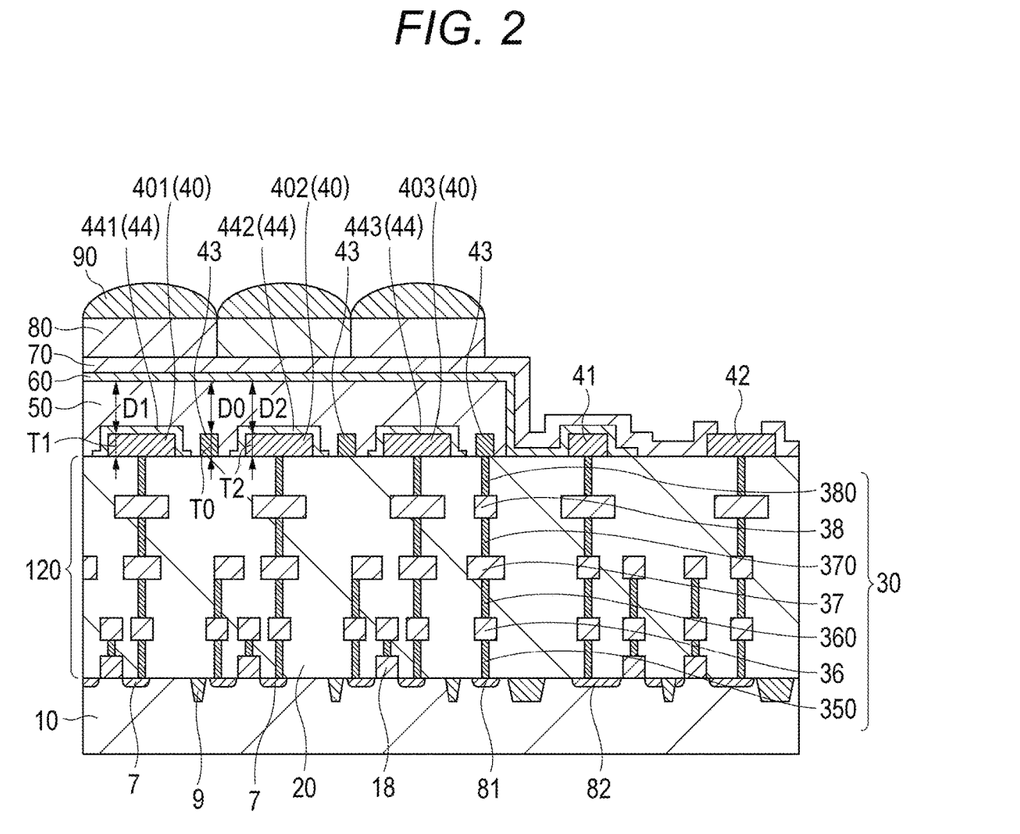
FIG. 2 is a schematic sectional view illustrating an example of an imaging device.

The imaging device 1000 according to a first exemplary embodiment will be described with reference to FIG. 2. FIG. 2 illustrates a cross section of the pixel region 1 and a cross section of the peripheral region 2, in the A-A' line of FIG. 1B. As illustrated in FIG. 2, an element isolation portion 9 by means of shallow trench isolation (STI) or the like is formed in a semiconductor substrate 10 in which a p-type well is formed. Further, an impurity region 7 that functions as a source or a drain of each transistor of the pixel circuit 110, and impurity regions 81 and 82 function as connecting portions of the control circuit 6 are provided in the semiconductor substrate 10. A gate electrode layer that forms the gate 18 and other gates 14 and 19 (not illustrated) is provided on the semiconductor substrate 10 through a gate insulating film (not illustrated). These structures are common to the respective pixel circuits 111, 112, and 113 of the first pixel 101, the second pixel 102, and the third pixel 103.

A contact plug 350 that forms the connecting portions 31 to 35 illustrated in FIG. 1B is provided on the semiconductor substrate 10, and further, a first wiring layer 36 connected with the contact plug 350 is provided. A second wiring layer 37 is provided on the first wiring layer 36 through a via plug 360, and a third wiring layer 38 is provided on the second wiring layer 37 through a via plug 370. A via plug 380 is provided on the wiring layer 38. The wiring layers, contact plugs, and via plugs configure a conductive member 30. The conductive member 30 is supported by an insulating member 20 in a periphery of the conductive member 30. To be specific, the insulating member 20 is configured from a plurality of insulating layers, respective layers being positioned between the wiring layers, or at the same heights as the respective wiring layers. In this way, a wiring structure 120 is formed on the semiconductor substrate 10 by the conductive member 30 and the insulating member 20.

A plurality of pixel electrodes 40 is provided on the wiring structure 120 in a matrix manner. FIG. 2 illustrates a first pixel electrode 401, a second pixel electrode 402 adjacent to the first pixel electrode 401, and a third pixel electrode 403 adjacent to the second pixel electrode 402, of the plurality of pixel electrodes 40. The pixel electrode 40 is configured from at least one of metal such as aluminum, copper, tungsten, titanium, and tantalum, and metal compounds such as titanium nitride and tantalum nitride. For example, the pixel electrode 40 can be a multilayer film including a conductive layer having any of metal including aluminum, copper, and tungsten, as a main component, and a barrier metal layer having any of titanium, titanium nitride, and tantalum nitride, as a main component. The pixel electrodes 401, 402, and 403 may be a single layer film. The thickness of the pixel electrode 40 is, for example, from 0.01 to 1 μm, both inclusive. The thickness of the pixel electrode 40 may be smaller than the thickness of the wiring layers 36, 37, and 38 that configure the conductive member 30. Further, the pixel electrode 40 can include wiring 41 and a connecting electrode 42 on the same layer. The connecting electrode 42 is an electrode to which a connecting member such as a bonding wire or a bump is connected in order to electrically connect the chip with an external circuit, and may also be called pad.

The intermediate electrode 43 is arranged in the pixel boundary portion 200. The intermediate electrode 43 is in contact with the photoelectric conversion film 50, and is provided in a position corresponding to between the pixel electrodes 40. The position corresponding to between the pixel electrodes 40 is a position between the pixel electrodes or a position above or below between the pixel electrodes. In this example, the intermediate electrode 43 extends between the first pixel electrode 401 and the second pixel electrode 402, and between the third pixel electrode 403 and the second pixel electrode 402. The intermediate electrode 43 is electrically insulated from the pixel electrodes 40 so that a potential different from those of the pixel electrodes 40 can be supplied. The intermediate electrode 43 is connected with the control circuit 6 through the conductive member 30, and a predetermined potential is supplied from the control circuit 6 to the intermediate electrode 43. FIG. 2 illustrates an example in which the intermediate electrode 43 is connected with the impurity region 81 that forms a part of the control circuit 6, through the conductive member 30. The intermediate electrode 43 suppresses an image lag caused in an image, by discharging electric carriers existing in the photoelectric conversion film 50 and causing the image lag. The electric carriers that cause the image lag exist in the pixel boundary portion 200.

The intermediate electrode 43 is a conductive member having metal or a metal compound, as a main component, similarly to the pixel electrode 40. The intermediate electrode 43 may be configured from the same material as the pixel electrode 40, or may be configured from the same material as the wiring 41 or the connecting electrode 42. However, the intermediate electrode 43 can be configured from a material different from the aforementioned materials. The thickness of the intermediate electrode 43 is T0, the thickness of the first pixel electrode 401 is T1, and the thickness of the second pixel electrode 402 is T2. The thickness T1 and T2 may be different. The intermediate electrode 43 may be thicker or thinner than the pixel electrode 40, or may have the same thickness as the pixel electrode 40. However, it is favorable that the intermediate electrode 43 is thicker than the pixel electrodes 40 (T1<T0 and T2<T0). In the case where the intermediate electrode 43 is made thicker than the pixel electrodes 40, light incident on between the pixel electrodes in a diagonal direction is shaded by the intermediate electrode 43. Therefore, crosstalk between pixels can be suppressed.

An insulating film 44 is provided on the pixel electrode 40. The insulating film 44 is 1 nm or more, for example, and can be 100 nm or less. The material of the insulating film 44 can be a high-k material configured from a silicon compound such as silicon oxide, silicon nitride, or silicon oxynitride, or a metal oxide such as hafnium oxide.

The photoelectric conversion film 50 is provided on the pixel electrode 40 and the intermediate electrode 43, and a so-called MIS structure having the pixel electrode 40 as metal, the insulating film 44 as an insulator, and the photoelectric conversion film 50 as a semiconductor is formed. Note that the pixel electrodes 401, 402, and 403 are not necessarily configured from only metal as long as the material exhibits metallic behavior, and the photoelectric conversion film 50 is not necessarily configured from only a semiconductor as long as the material exhibits semiconductor behavior. The photoelectric conversion film 50 continuously covers the plurality of pixel electrodes 40 and the intermediate electrode 43. The insulating film 44 has an opening in the pixel, and at least a part of an upper surface of the intermediate electrode 43 is in contact with the photoelectric conversion film without an insulating film. The intermediate electrode 43 is in contact with a surface (lower surface) of the photoelectric conversion film 50, the surface being on a side of a pixel electrode 40 (lower side). In this example, the intermediate electrode 43 is provided apart from the insulating film 44. However, the insulating film 44 may be in contact with the intermediate electrode 43, and may extend between the photoelectric conversion film 50 and the intermediate electrode 43. Even in that case, the insulating film 44 is arranged such that the photoelectric conversion film 50 and the intermediate electrode 43 are in contact with each other.

The photoelectric conversion film 50 may be a single layer film or may be a multilayer film. The material of the photoelectric conversion film 50 may be an inorganic material or may be an organic material. As the inorganic material, an element semiconductor such as Si or Ge, or a compound semiconductor such as GaAs or ZnO, which is a single crystal, polycrystal, or amorphous semiconductor material, is used. Another compound semiconductor is a III-V compound semiconductor such as BN, GaP, AlSb, or GaAlAsP, a II-VI compound semiconductor such as CdSe, ZnS, or HdTe, or a IV-VI compound semiconductor such as PbS, PbTe, or CuO. As another inorganic material, a compound (CIGS) of copper, indium, and gallium, and selenium or sulfur, or crystal Se (selenium) may be used. Examples of an organic semiconductor material include fullerene, coumarin 6 (C6), rhodamine 6G (R6G), zinc phthalocyanine (ZnPc), quinacridone, phthalocyanine, and naphthalocyanine. The photoelectric conversion film 50 as a multilayer film can have a pin structure made of a p-type semiconductor layer, an i-type semiconductor layer, and an n-type semiconductor layer. The photoelectric conversion film 50 may be made of a composite material using both of an inorganic material and an organic material. The photoelectric conversion film 50 may be a quantum dot film having a quantum dot structure in which semiconductor crystals made of Si having a particle diameter of about 1 to 10 nm are arranged. The thickness of the photoelectric conversion film 50 is appropriately set according to light absorption characteristics based on the material of the photoelectric conversion film 50. When the photoelectric conversion film 50 made of silicon is used, the thickness of the photoelectric conversion film 50 is from 1 to 5 μm, both inclusive, for example. Further, when the photoelectric conversion film 50 having the above-described quantum dot structure is used, the thickness of the photoelectric conversion film 50 is from 0.1 to 1 μm, both inclusive, for example, and can be less than 0.5 μm. Especially, an amorphous silicon film, an organic semiconductor film, and a quantum dot film, which can be easily formed into a thin film of less than 1 μm, are favorable. Further, the quantum dot film that is sufficiently compensated for interface defect is more favorable because complete depleting is easy.

A counter electrode 60 is provided on the photoelectric conversion film 50. The counter electrode 60 is a conductor film facing the pixel electrodes 40 and the intermediate electrode 43 through the photoelectric conversion film 50. In the present exemplary embodiment, the counter electrode 60 and the photoelectric conversion film 50 are in contact with each other. The counter electrode 60 is in contact with a surface (upper surface) of the photoelectric conversion film 50, the surface being on a side (upper side) opposite to the side (lower side) of the pixel electrode 40. Further, the counter electrode 60 is continuously provided along an upper surface 501. Since the conductive film that serves as the counter electrode 60 is commonly provided to the pixels, the counter electrode can also be referred to as common electrode. The counter electrode 60 has optical transparency in a wavelength region of light photoelectrically converted in the photoelectric conversion film 50, for example, in a visible light region. As the material of the counter electrode 60, indium tin oxide (ITO) or zinc oxide (ZnO) is favorable. The counter electrode 60 is connected with the control circuit 6 through the conductive member 30, and a predetermined potential is supplied from the control circuit 6 to the counter electrode 60. FIG. 2 illustrates an example in which the counter electrode 60 is in contact with the wiring 41, and is further connected with the impurity region 82 that forms a part of the control circuit 6, through the conductive member 30.

The distance between the counter electrode 60 and the intermediate electrode 43 is D0, the distance between the counter electrode 60 and the first pixel electrode 401 is D1, and the distance between the counter electrode 60 and the second pixel electrode 402 is D2. The distances D1 and D2 may be different. It is favorable that the distance D0 is smaller than at least one of the distance D1 and the distance D2 (D0<D1 or D0<D2). The distance between the counter electrode 60 and the intermediate electrode 43 is made small, so that efficiency of discharge of the electric carriers existing in the pixel boundary portion 200 can be enhanced.

A dielectric film 70 is provided on the counter electrode 60. The dielectric film 70 faces the pixel electrodes 40 through the photoelectric conversion film 50, and is continuously provided along the upper surface 501. The dielectric film 70 has an opening in the connecting electrode 42 and exposes the connecting electrode 42 while covering the wiring 41. The dielectric film 70 can function as at least one of an antireflection film, a passivation film, and a planarizing film. The dielectric film 70 may not cover the counter electrode 60 and/or the wiring 41.

It is favorable that the refractive index of the counter electrode 60 is lower than the refractive index of the photoelectric conversion film 50. It is favorable that the refractive index of the dielectric film 70 is lower than the refractive index of the photoelectric conversion film 50 and/or the refractive index of the counter electrode 60. The relationship among the refractive index films is caused to be the dielectric film 70<the counter electrode 60<the photoelectric conversion film 50, so that an antireflection structure that suppresses reflection of light incident on the photoelectric conversion film 50 from the dielectric film 70 can be realized.

For example, as the material of the counter electrode 60, a transparent conductive material such as ITO having the refractive index of 1.9 to 2.2 can be used. As the material of the photoelectric conversion film 50, a composite material of silicon having the refractive index of about 3 to 4 and the quantum dot film having the refractive index of 1.5 to 2.5 can be used. For example, a composite material in which particles having the refractive index of 2.5 or more are dispersed in a resin having the refractive index of less than 2.0 is used, so that an effective refractive index can be made larger than 2.2. As the material of the dielectric film 70, silicon oxide having the refractive index of 1.4 to 1.6, silicon oxynitride having the refractive index of 1.6 to 1.8, or silicon nitride having the refractive index of 1.8 to 2.3 can be used. A plurality of dielectric layers made of the aforementioned materials is layered, and the dielectric film 70 may be formed into a multilayer film. The materials of the dielectric film 70, the counter electrode 60, and the photoelectric conversion film 50 may just be selected to satisfy the above-described refractive index relationship.

A color filter array 80 is provided on the dielectric film 70, and a microlens array 90 is provided on the color filter array 80.

When light is incident on the photoelectric conversion film 50 through the microlens array 90, the color filter array 80, the dielectric film 70, and the counter electrode 60, signal electric carriers are caused by photoelectric conversion of the light. The signal electric carriers may be positive holes or may be electrons. The high/low relation of the potential of the pixel electrodes 40 and the potential of the counter electrode 60 is set according to polarity of the signal electric carriers. A potential according to the amount of the signal electric carriers and the capacity of the MIS structure is exhibited in each of the pixel electrodes 40, and the potential of the impurity region 15 is changed through the conductive member 30 and through the connecting portion 31 illustrated in FIG. 1B. When the switch transistor 12 is turned ON, the potential of the impurity region 16 is changed according to the potential of the impurity region 15. The amplifying transistor 11 including the gate 19 connected with the impurity region 16 can output a signal according to the potential of the impurity region 16, that is, a signal according to the electric carriers of the corresponding photoelectric conversion film 50. When the switch transistor 12 is turned OFF, and the reset transistor 13 is turned ON, the potential of the impurity region 16 can be reset. Refresh of the photoelectric conversion film 50, that is, discharge of the signal electric carriers can be performed by causing the potentials of the counter electrode 60 and the intermediate electrode 43 to be a refresh potential. The intermediate electrode 43, which is a discharge destination of the electric carriers, exists not only below the counter electrode 60 but also below the photoelectric conversion film 50. Therefore, discharge of the electric carriers can be effectively performed. The refresh potentials of the counter electrode 60 and the intermediate electrode 43 at this time may be the same potential, or may be different potentials. Application of these refresh potentials is performed by the control circuit 6 illustrated in FIG. 1. The control circuit 6 can be provided common to the counter electrode 60 and the intermediate electrode 43, or may be divided into a portion connected with the counter electrode 60, and a portion connected with the intermediate electrode 43.

At the time of refresh of the first pixel 101 including the first pixel electrode 401, it is favorable that a potential difference between the intermediate electrode 43 and the first pixel electrode 401 is larger than a potential difference between the first pixel electrode 401 and the second pixel electrode 402. Further, at the time of refresh of the second pixel 102 including the second pixel electrode 402, it is favorable that a potential difference between the intermediate electrode 43 and the second pixel electrode 402 is larger than the potential difference between the first pixel electrode 401 and the second pixel electrode 402. Timing of refresh of the first pixel 101 and the second pixel 102 may be the same, or may be different. Note that approximately the same potential can be supplied to the mutually adjacent first pixel electrode 401 and second pixel electrode 402, during a photoelectric conversion period (one vertical scanning period and/or one horizontal scanning period). Therefore, the potential difference between the first pixel electrode 401 and the second pixel electrode 402 is smaller than a potential difference between the first pixel electrode 401 and the counter electrode 60 and/or a potential difference between the second pixel electrode 402 and the counter electrode 60.

Figure 3A:
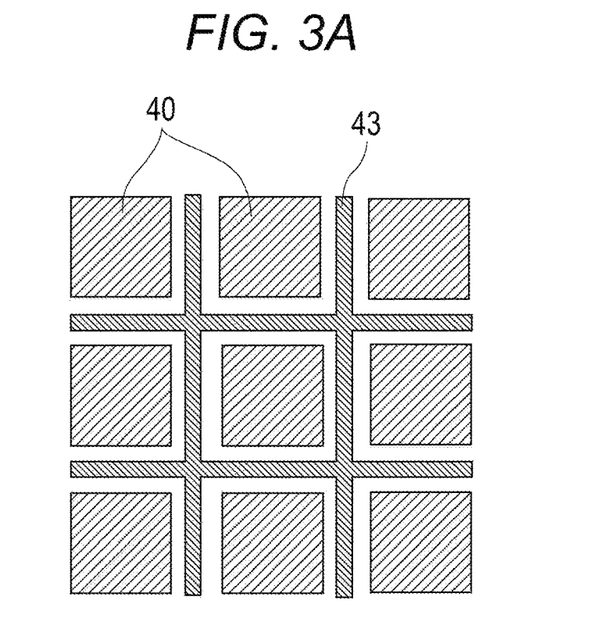
FIGS. 3A and 3B are schematic plan views illustrating an example of an imaging device.
Figure 3B:
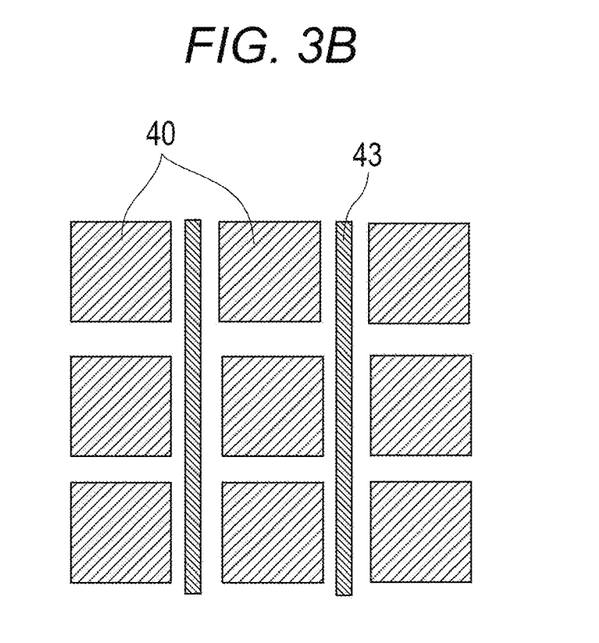

At the time of refresh of the first pixel 101 including the first pixel electrode 401, it is favorable that the potential difference between the intermediate electrode 43 and the first pixel electrode 401 is larger than a potential difference between the intermediate electrode 43 and the counter electrode 60. Further, at the time of refresh of the second pixel 102 including the second pixel electrode 402, it is favorable that the potential difference between the intermediate electrode 43 and the first pixel electrode 401 and/or the potential difference between the intermediate electrode 43 and the second pixel electrode 402 are larger than the potential difference between the intermediate electrode 43 and the counter electrode 60. In doing so, the electric carriers can be more efficiently discharged in the intermediate electrode 43, and the image lag can be suppressed. FIGS. 3A and 3B are plan views of the pixel electrodes 40 and the intermediate electrode 43 in the pixel. The intermediate electrode 43 can be arranged to have a lattice shape. It is favorable to arrange the intermediate electrode 43 to have a grid shape as illustrated in FIG. 3A, or a stripe shape as illustrated in FIG. 3B, as the lattice shape.

A method of manufacturing the imaging device 1000 illustrated in FIG. 2 will be described with reference to FIGS. 4A to 4E. The semiconductor substrate 10 on which various transistors of the pixel circuit 110 and various transistors of the peripheral circuit are provided, illustrated in FIG. 2, is produced using appropriate semiconductor manufacturing processes. The wiring structure 120 including the conductive member 30 and the insulating member 20 is formed on the semiconductor substrate 10, using appropriate multilayer wiring processes.

Figure 4A:
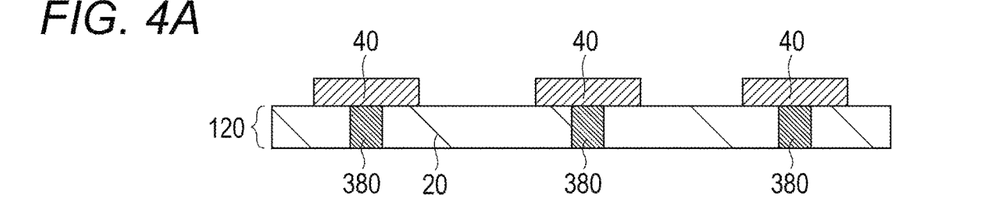
FIGS. 4A to 4E are schematic sectional views illustrating an example of a method of manufacturing an imaging device.
Figure 4B:
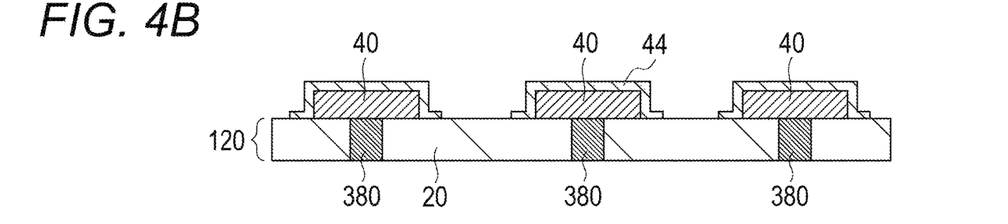
Figure 4C:
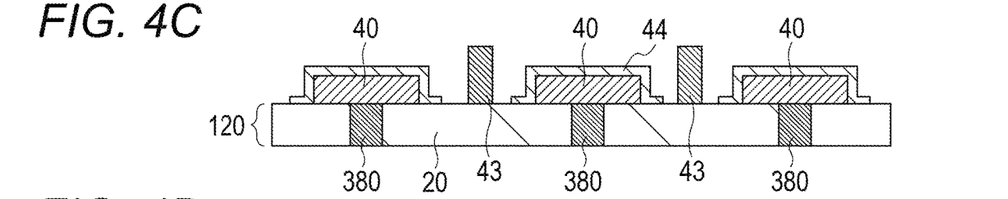

As illustrated in FIG. 4A, a conductive film is formed on the wiring structure 120 made of the insulating member 20 and the conductive member 30, and the conductive film is patterned, so that the pixel electrodes 40 are formed. Next, as illustrated in FIG. 4B, an insulating film formed to cover the pixel electrodes 40 is patterned by etching or the like, so that a plurality of insulating films 44, each of which covers each pixel electrode 40, is formed. The pixel electrodes 40 are positioned between the insulating member 20 and the insulating films 44. Further, a conductive film is formed to cover the pixel electrodes 40 and the insulating films 44, and then the conductive film is patterned by etching or the like, so that intermediate electrode 43 is formed between the adjacent pixel electrodes 40, as illustrated in FIG. 4C. As illustrated in FIG. 4C, the conductive film thicker than the pixel electrodes 40 is formed, so that the intermediate electrode 43 can be thicker than the pixel electrodes 40. Further, the intermediate electrode 43 is formed using a different material from the pixel electrodes 40, so that a material for not causing deterioration of the photoelectric conversion film 50 and contamination even if the intermediate electrode 43 is in contact with the photoelectric conversion film 50 can be more easily selected. For example, it is favorable to use, for the intermediate electrode 43, a material that is less likely to be diffused to the photoelectric conversion film 50, that is, a material having a smaller diffusion coefficient for the photoelectric conversion film 50, than the pixel electrodes 40. Note that, here, an example of patterning the insulating film to serve as the insulating films 44 in the pixel region 1 has been described. However, the patterning may not be performed. In that case, the intermediate electrode 43 can be formed on the insulating film 44 extending in the pixel boundary portion, and the insulating film 44 extends between the insulating member 20 and the intermediate electrode 43.

Figure 4D:
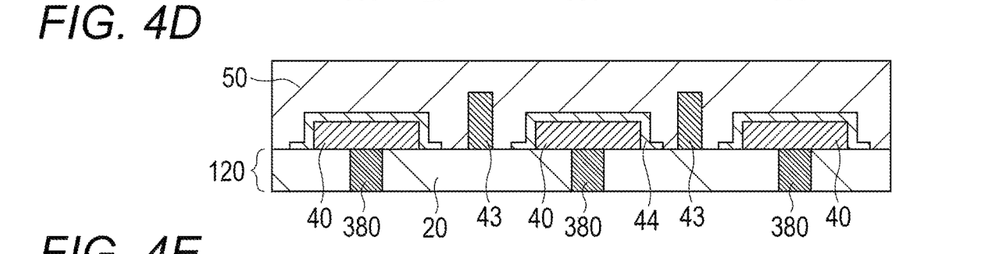
Figure 4E:
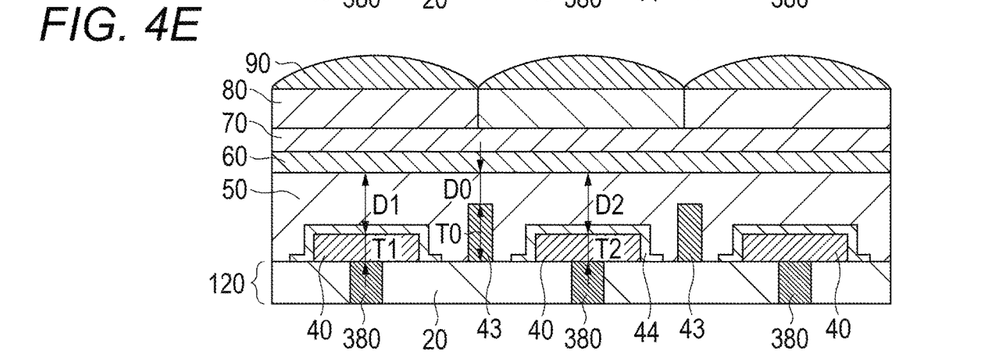

Further, the photoelectric conversion film 50 is formed as illustrated in FIG. 4D. The photoelectric conversion film 50 is formed of an organic or inorganic semiconductor material by means of any of vapor phase film formation such as a CVD method, liquid phase film formation such as a coating method, and solid phase film formation.

Following that, the counter electrode 60 is formed on the photoelectric conversion film 50. The counter electrode 60 is formed of the transparent conductive material such as ITO or ZnO, by a sputtering method, a CVD method, a spin coating method, or the like. Further, the dielectric film 70 is formed on the counter electrode 60. The dielectric film 70 can be a single layer film or a multilayer film including at least one of an inorganic material layer made of silicon oxide or silicon nitride for the purpose of passivation, and an organic material layer (resin layer) for the purpose of planarization. Further, the color filter array 80 and the microlens array 90 are formed on the dielectric film 70. Then, the imaging device 1000 illustrated in FIG. 2A can be obtained.

According to the present exemplary embodiment, the intermediate electrode 43 that can discharge the electric carriers exists not only below the counter electrode 60 but also below the photoelectric conversion film 50. Therefore, the electric carriers can be efficiently discharged at the time of refresh. Therefore, occurrence of the image lag due to remaining of the electric carriers can be suppressed.

Second Exemplary Embodiment

Figure 5A:
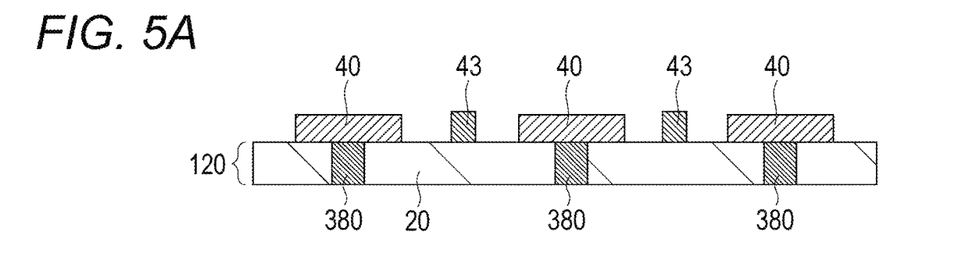
FIGS. 5A to 5C are schematic sectional views illustrating an example of a method of manufacturing an imaging device.
Figure 5B:
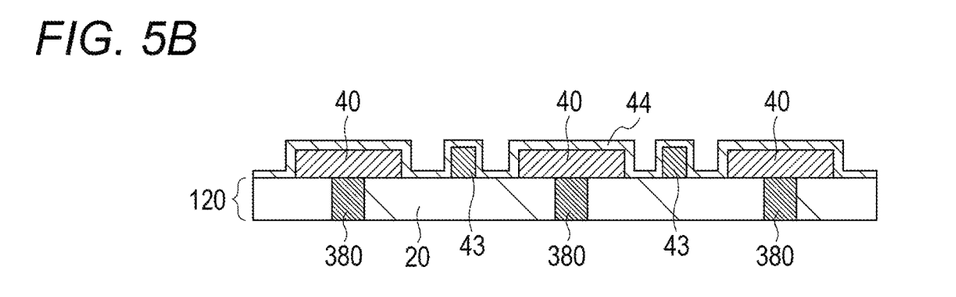

Next, a method of manufacturing an imaging device according to a second exemplary embodiment will be described with reference to FIGS. 5A to 5C. The second exemplary embodiment is different from the first exemplary embodiment in a method of forming an intermediate electrode 43 and insulating films 44. As illustrated in FIG. 5A, a conductive film is formed on a wiring structure 120, and the conductive film is patterned, so that pixel electrodes 40 and the intermediate electrode 43 are formed at the same time. As illustrated in FIG. 5B, an insulating film is deposited to cover the pixel electrodes 40 and the intermediate electrode 43.

Figure 5C:
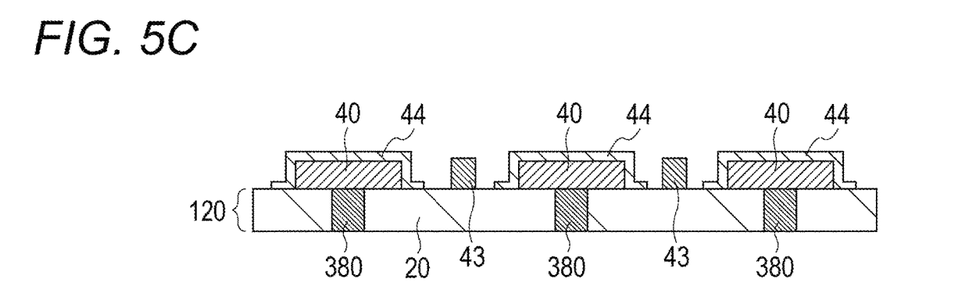

As illustrated in FIG. 5C, the insulating film is patterned to expose at least a part of the intermediate electrode 43 to form the insulating films 44. Subsequent processes are similar to the first exemplary embodiment, and thus description is omitted. In the second exemplary embodiment, the pixel electrodes and the intermediate electrodes are formed at the same time, so that the process can be reduced, and position accuracy of the intermediate electrodes to the pixel electrodes is improved, compared with the first exemplary embodiment.

Third Exemplary Embodiment

Figure 6A:
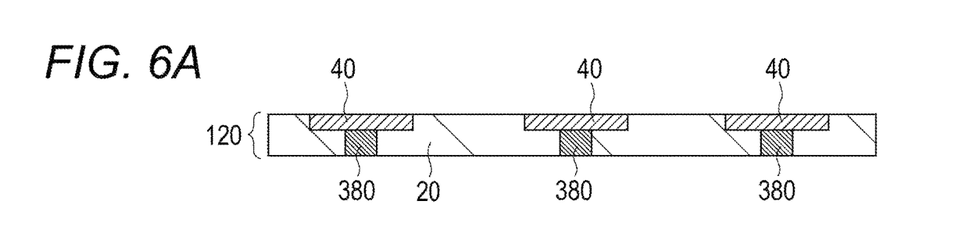
FIGS. 6A to 6E are schematic sectional views illustrating a method of manufacturing an imaging device.
Figure 6B:
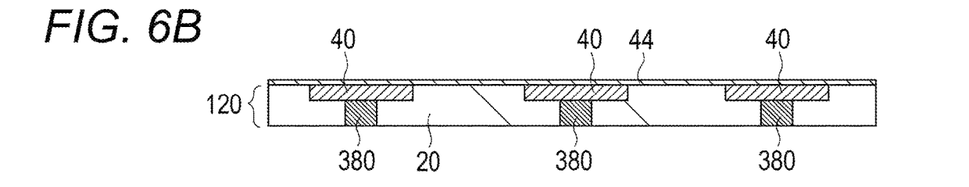
Figure 6C:
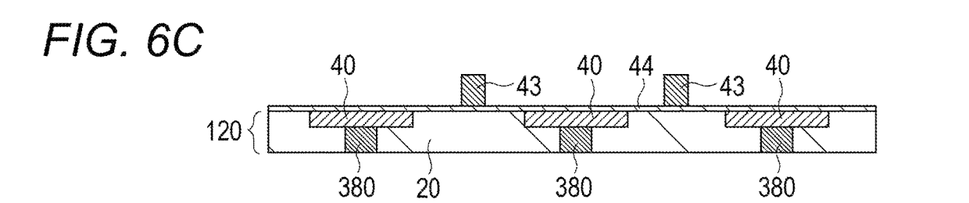
Figure 6D:
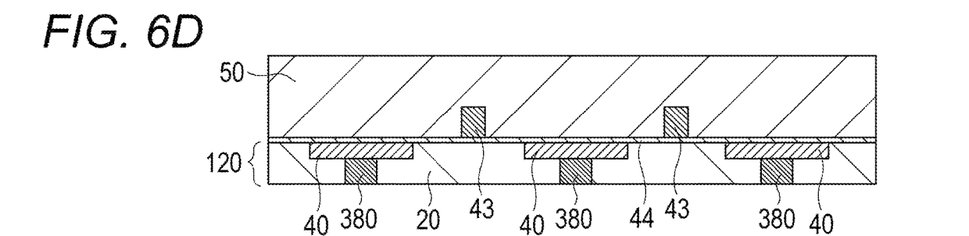
Figure 6E:
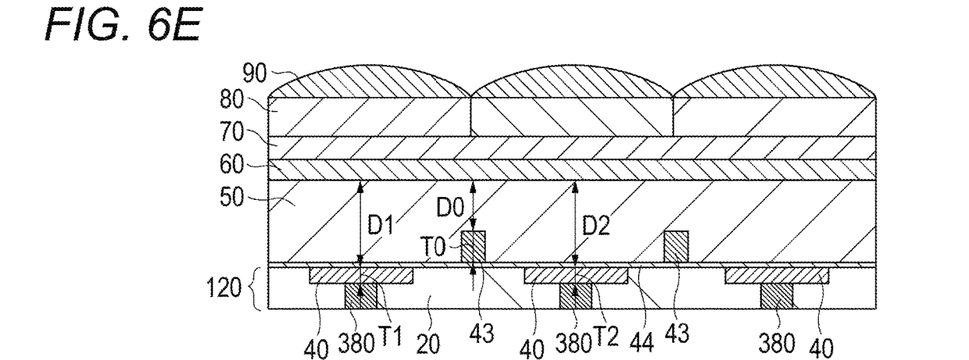

Next, a method of manufacturing an imaging device according to a third exemplary embodiment will be described with reference to FIGS. 6A to 6E. The third exemplary embodiment is different from the first exemplary embodiment in a method of forming pixel electrodes 40. As illustrated in FIG. 6A, the pixel electrodes 40 are embedded in an insulating member 20 by a damascene method. Therefore, a plantation surface in which upper surfaces of the pixel electrodes 40 and an upper surface of the insulating member 20 are continued is formed. Next, as illustrated in FIG. 6B, an insulating film 44 is formed to cover the pixel electrodes 40 and the insulating member 20. Here, although the insulating film 44 can be patterned similarly to the first exemplary embodiment, the insulating film 44 is remained in a pixel boundary portion in the present example. Next, a conductive film is formed on the insulating film 44, and the conductive film is patterned, so that an intermediate electrode 43 is formed. The pixel electrode 40 is arranged between the insulating member 20 and the insulating film 44, and the insulating film 44 extends between the insulating member 20 and the intermediate electrode 43. The intermediate electrode 43 is different from the first and second exemplary embodiments, and is formed above between the pixel electrodes 40, instead of between the pixel electrodes 40. According to such a form, a distance D0 can be made small while distances D1 and D2 are made large. Therefore, both of improvement of sensitivity and prevention of an image lag can be established.

In the third exemplary embodiment, the pixel electrodes 40 are embedded by a damascene method. However, the pixel electrodes 40 may be arranged above the insulating member 20 after the intermediate electrode 43 is embedded in the insulating member 20 by a damascene method. In that case, the intermediate electrode 43 is positioned below between the pixel electrodes 40.

In the above-described exemplary embodiments, the imaging device 1000 that includes the first pixel electrode 401, the second pixel electrode 402 adjacent to the first pixel electrode 401, and the photoelectric conversion film 50 that continuously cover the first pixel electrode 401 and the second pixel electrode 402 has been described. In the imaging device 1000, the insulating film 44 is provided between the first pixel electrode 401 and the photoelectric conversion film 50, and between the second pixel electrode 402 and the photoelectric conversion film 50. Further, the intermediate electrode 43 is provided in the position corresponding to between the first pixel electrode 401 and the second pixel electrode 402, the intermediate electrode 43 being in contact with the surface of the photoelectric conversion film 50, the surface being on the side where the first pixel electrode 401 and the second pixel electrode 402 are arranged. The present technology can be appropriately changed without departing from at least this form. For example, the pixel electrodes 40 and the intermediate electrode 43 can be embedded in the insulating member 20, in combination of the second and third exemplary embodiments. In that case, the intermediate electrode 43 is positioned between the pixel electrodes 40. Further, the pixel electrodes 40 may be arranged on the insulating member 20 after the intermediate electrode 43 is embedded in the insulating member 20 by a damascene method. In that case, the intermediate electrode 43 is positioned below between the pixel electrodes 40.

According to the present technology, an image lag can be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imaging device comprising:
   a substrate which is provided with pixel circuits;
   pixel electrodes which is arranged above the substrate and connected to the pixel circuits;
   a counter electrode which faces the pixel electrodes; and
   a photoelectric conversion film which is continuously arranged between the pixel electrodes and the counter electrode;
   an intermediate electrode which is arranged between the photoelectric conversion film and the substrate so that the intermediate electrode is arranged between the pixel electrodes; and
   an insulating member which is arranged between the substrate and the pixel electrode,
   wherein a first distance between the counter electrode and the pixel electrodes is smaller than a distance between the counter electrode and the insulating member,
   wherein a second distance between the counter electrode and the intermediate electrode is smaller than the distance between the counter electrode and the insulating member,
   wherein a difference between the first distance and the second distance is smaller than a thickness of the intermediate electrode, and
   wherein electric carriers in the photoelectric conversion film are discharged through the intermediate electrode.

2. The imaging device according to claim 1, further comprising:
   a control circuit configured to set a potential difference between the intermediate electrode and the pixel electrodes to become larger than a potential difference between the pixel electrodes.

3. The imaging device according to claim 1, further comprising an insulating film which is arranged between the pixel electrodes and the photoelectric conversion film.

4. The imaging device according to claim 1, further comprising:
   a control circuit configured to set a potential difference between the intermediate electrode and the pixel electrodes to become larger than a potential difference between the intermediate electrode and the counter electrode.

5. The imaging device according to claim 1, wherein the second distance between the counter electrode and the intermediate electrode is smaller than the first distance between the counter electrode and the pixel electrodes.

6. The imaging device according to claim 1, wherein a width of the intermediate electrode is smaller than a width of one of the pixel electrodes.

7. The imaging device according to claim 1, wherein a material of the intermediate electrode is the same as a material of the pixel electrodes, and/or the first distance is the same as the second distance.

8. The imaging device according to claim 3, wherein the intermediate electrode is spaced apart from the insulating film.

9. The imaging device according to claim 3, wherein a distance between the insulating film and the counter electrode is different from the second distance between the intermediate electrode and the counter electrode.

10. The imaging device according to claim 1, wherein the intermediate electrode has a grid shape or a stripe shape.

11. The imaging device according to claim 3, wherein a distance between the insulating film and the counter electrode is larger than the second distance between the intermediate electrode and the counter electrode.

12. The imaging device according to claim 3, wherein a distance between the insulating film and the counter electrode is smaller than the second distance between the intermediate electrode and the counter electrode.

13. The imaging device according to claim 1,
   wherein the substrate is a semiconductor substrate,
   one of the pixel circuits includes a transistor,
   an impurity region as a source or a drain of the transistor is arranged in the semiconductor substrate, and
   one of the pixel electrodes is connected to the impurity region.

14. The imaging device according to claim 1, wherein each of the pixel circuits includes an amplifying transistor which configures a source follower circuit.

15. The imaging device according to claim 1,
   wherein the substrate is a semiconductor substrate in which an impurity region which is arranged, and
   one of the pixel circuits includes a first transistor which has a gate connected with the impurity region, and includes a second transistor to reset a potential of the impurity region.

16. The imaging device according to claim 15,
   wherein the one of the pixel circuits includes a third transistor,
   the impurity region is a drain of the third transistor, and
   one of the pixel electrodes is connected with a source of the third transistor.

17. The imaging device according to claim 1, wherein the counter electrode extends in contact with the insulating member.

18. The imaging device according to claim 1, further comprising:
   a dielectric film which is arranged above the insulating member, and
   a wiring which is arranged on the insulating member;
   wherein the counter electrode is arranged between the photoelectric conversion film and the dielectric film, and
   the counter electrode extends to have a portion being in contact with the wiring, the portion being arranged between the dielectric film and the wiring.

19. The imaging device according to claim 1, further comprising:
   a dielectric film which is arranged above the insulating member, and
   a connecting electrode which is arranged on the insulating member;
   wherein the counter electrode is arranged between the photoelectric conversion film and the dielectric film,
   the connecting electrode is arranged between the dielectric film and the insulating member, and
   the dielectric film has an opening on the connecting electrode.

20. A imaging system comprising:
   an imaging device according to claim 1; and
   at least one of (i) a signal processing device that processes a signal obtained from the imaging device and (ii) a display that displays an image captured by the imaging device.

* * * * *